United States Patent [19]

Morris

[11] Patent Number: 4,938,257
[45] Date of Patent: Jul. 3, 1990

[54] PRINTED CIRCUIT CLEANING APPARATUS

[75] Inventor: Gilbert V. Morris, Amherst, N.H.

[73] Assignee: Teledyne Industries, Inc., Los Angeles, Calif.

[21] Appl. No.: 933,768

[22] Filed: Nov. 21, 1986

[51] Int. Cl.$^5$ .............................................. B08B 3/02
[52] U.S. Cl. ................................. 134/64 R; 134/105; 134/108; 134/122 R; 134/172; 134/199
[58] Field of Search ................. 15/77; 134/64 R, 108, 134/122 R, 199, 129, 83, 105, 172

[56] References Cited

U.S. PATENT DOCUMENTS

| | | | |
|---|---|---|---|
| 3,421,211 | 1/1969 | Eaves et al. | |
| 3,423,254 | 1/1969 | Sufford et al. | 266/113 |
| 3,603,329 | 9/1971 | White | 134/199 X |
| 3,650,282 | 3/1972 | Hollyer et al. | 134/172 X |
| 3,687,145 | 8/1972 | Schrader et al. | 134/122 R X |
| 3,791,345 | 2/1974 | McCutcheon | 118/316 X |
| 3,868,272 | 2/1975 | Tardoskegyi | |
| 3,871,914 | 3/1975 | Goffredo et al. | 134/199 X |
| 4,132,393 | 1/1979 | Nakamura et al. | 266/113 X |
| 4,149,703 | 4/1979 | Safford | 134/199 X |
| 4,415,143 | 11/1983 | Ebata | 134/122 R |
| 4,425,869 | 1/1984 | Hull | 134/64 R X |
| 4,479,849 | 10/1984 | Frantzen | |
| 4,486,009 | 12/1984 | Kopf | 266/133 |
| 4,667,419 | 5/1987 | Bovone | 15/77 |
| 4,709,716 | 12/1987 | Raush et al. | 134/122 R |
| 4,723,562 | 2/1988 | Wilmotte et al. | 134/199 X |
| 4,766,916 | 8/1988 | Bowden | 134/199 X |

Primary Examiner—Frankie L. Stinson
Attorney, Agent, or Firm—Hayes, Soloway, Hennessey & Hage

[57] ABSTRACT

Apparatus for cleaning printed circuit panels includes a pair of manifolds having closely spaced faces forming a narrow passage therebetween. Transverse slots in the manifold faces supply cleaning liquid to printed circuit panels conveyed through the narrow passage. A high velocity flow of cleaning liquid along the surfaces of the printed circuits effectively clean them during their travel through a relatively short distance in the passage. A cleaning system for printed circuits includes a plurality of stages each of which comprises such cleaning apparatus.

5 Claims, 3 Drawing Sheets

PRINTED CIRCUIT CLEANING APPARATUS

BACKGROUND OF THE INVENTION

Printed circuits are formed with major dimensions of length and width and contain one or more circuits. The thickness of the printed circuit panels varies for many different reasons and directly affects panel flexibility.

For example, printed circuits made with multiple conductor planes use a bonded dielectric layer or layers for separation. Holes perforated through the circuit substrate serve a number of purposes including solder terminals for installation into another assembly, plated through hole interconnections between copper conductors, and tooling registration holes. At one stage, some or all of the copper conductors must be coated with solder, often referred to as solder leveling the circuits.

After being soldered, for example in a solder leveling apparatus described in applicant's U.S. Pat. No. 4,608,941 for Apparatus For Soldering Printed Circuit Panels, the printed circuit panels must be cleaned. Specifically, flux and other impurities remaining on the printed circuits must be removed.

In addition, acid or alkaline based cleaners are used as etchants in processing printed circuits to remove copper oxides or to micro-etch the copper itself. These substances also must be removed by cleaning the printed circuits after such process steps.

In the past, printed circuits have been cleaned by conveying them past rotating brushes used with water or slurries as shown, for example, in U.S. Pat. No. 3,928,064 and U.S. Pat. No. 4,383,494. In addition to requiring cleaning stations of substantial length, such apparatus does not effectively remove all surface contaminants nor does it clean rapidly moving printed circuit panels. Moreover, fragile printed circuits are subject to deterioration and even breakage by the brushes.

Another commonly used method of cleaning printed circuit panels is by direct immersion in hot water containing detergents. The cleaning and rinsing process can be accelerated by agitation. However, this cleaning method does not lend itself to continuous cleaning of printed circuits being moved rapidly by a conveyor.

Other apparatus presently being used for cleaning printed circuits involves the use of spray washing and rinsing. Distribution manifolds containing multiple spray nozzles are directed towards the circuit panel surfaces. Since manifolds are high pressure, low velocity conduits, the nozzles create a pressure drop that propels the cleaning liquids at a high velocity to the printed circuit surfaces. The impact of the liquids results in an energy transfer that dislodges contaminates from the surface.

To maintain continuous effective spray cleaning at desired conveyor speeds, drainage of surface liquids is important. A printed circuit panel positioned in a horizontal plane has no gravitational drainage forces. Thus surface standing water (puddling) absorbs some of the impact energy which helps drainage but diminishes cleaning power. For this reason etching systems have different stock removal rates between top and bottom surfaces of printed circuits.

Examples of spray nozzle cleaning systems include U.S. Pat. No. 3,905,827, U.S. Pat. No. 3,421,211, U.S. Pat. No. 3,868,272, and U.S. Pat. No. 4,479,849.

It will be apparent from a review of these patents that the results obtained from using spray nozzles are affected by the number of nozzles, their distance from the surface, the nozzle spray angle, the nozzle orifice size, the manifold pressure used, the spray shape (fan, cone, etc.), fixed or oscillating manifolds, and the time the printed circuits are exposed to the spray nozzles which may depend on conveyor speed. Moreover, the cleaning apparatus requires process stations that use ten, fifteen or more lineal feet.

None of the prior art spray nozzle systems has proven satisfactory for effectively cleaning printed circuits traveling at conveyor speeds now used when printed circuits are processed, i.e., etched or soldered with state of the art processes.

SUMMARY OF THE INVENTION

The present invention provides a method and apparatus for cleaning printed circuits traveling at relatively high speeds, for example on the order of 30 feet per minute. The printed circuits are conveyed through one or more short tunnel-like passages. The top of the passage is the bottom of an upper manifold and the bottom of the passage is the top of a lower manifold. Transverse slots oppositely directed distribute a cleaning liquid such as water evenly along the passage. When a printed circuit panel is conveyed through the tunnel, passages between the upper and lower surfaces of the panel and the roof and floor of the passage or tunnel provide a high velocity flow of cleaning liquid along the circuit panel surfaces.

The transverse slots and tunnel are sized to maintain a continuous high velocity liquid flow without severely restricting or throttling a low pressure, high volume recirculating pump. The mass flow of liquid over and under the circuit panels is continuously drained through controlled leakage areas into a sump and recirculated. Conveyor rolls transport the panels through the narrow passage or tunnel with the input and output nips being separated only a short distance that is selected to handle panels of a desired minimum size. Thus the cleaning apparatus is relatively compact and much shorter in length than prior art cleaning systems.

In a preferred embodiment of the invention, movement of a printed circuit panel through input conveyer rolls causes the upper roll and the manifold to move upwardly to increase the tunnel height to accommodate panels of varying thicknesses.

A plurality of process stages can be used for cleaning the printed circuit panels. The initial stages use a heated water-detergent solution to wash the panels while the latter stages use hot water to rinse the printed circuits. With four stages, the length of the cleaning system can be on the order of only a few feet, far shorter than the less effective prior art cleaning systems.

DESCRIPTION OF EXEMPLARY EMBODIMENTS

Figure 1:
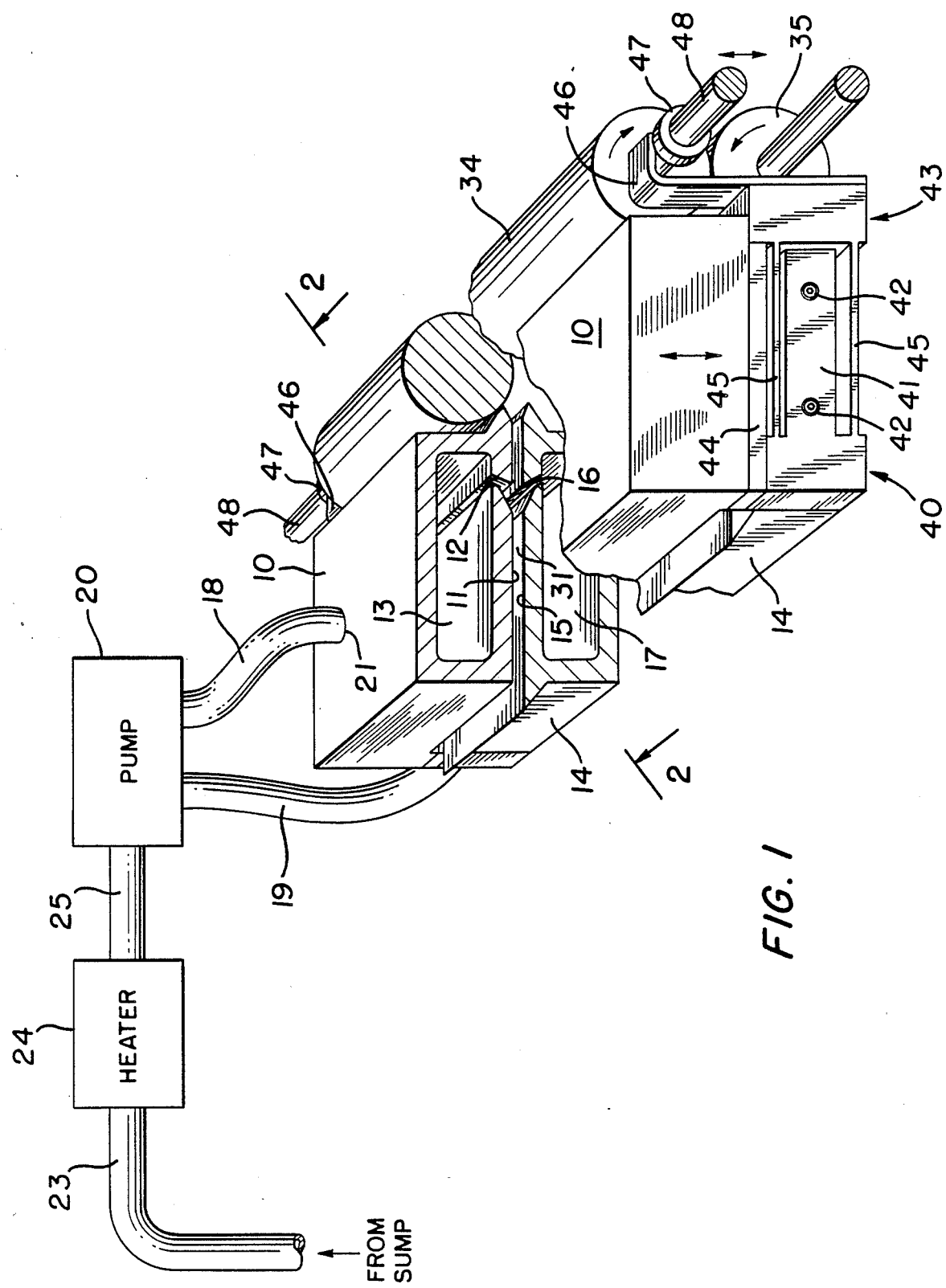
FIG. 1 is a perspective view of the inventive cleaning apparatus with portions omitted for clarity and broken away to show a partial cross-section.

Referring to the invention in greater detail with reference to the drawings, an upper manifold 10 includes a lower face 11 in which is formed a transverse slot 12 communicating with the manifold interior 13. A similar lower manifold 14 includes an upper face 15 in which is formed a transverse slot 16 communicating with the manifold interior 17. Hoses 18 and 19 connected to the output side of a low pressure high volume recirculating pump 20 and to an inlet 21 on the upper and lower manifolds supply heated cleaning liquid such as a water-detergent solution to the manifolds. A container or sump 22, shown diagrammatically by broken lines in FIG. 2, receives and catches liquid 20a flowing through the manifolds, as explained hereinafter. A hose or line 23 leads from the container or sump 22 to a heater 24 for heating the liquid and supplying it through a hose 25 to the pump 20. While for clarity the pump is shown delivering liquid directly to the manifolds, it often is preferable to place the heater on the output side of the pump.

To convey printed circuit panels 30 through a narrow passage or tunnel 31 formed by the manifold faces 11 and 15, suitable rolls 32 and 33 are mounted an appropriate distance from the input rolls 34 and 35 adjacent to the manifolds 10 and 14. Transverse flanges 11a and 15a extend horizontally from the faces 11 and 15, and then angle outwardly towards and into proximity with the rolls 34 and 35 to guide the panels 30 into the tunnel 31 between the manifolds 10 and 14.

Outlet rolls 36 and 37 adjacent the exit of the passage 31 receive the printed panels 30 after cleaning at this station has been accomplished. A transversely extending flange 15b for guiding the panels extends from the face 15 and is positioned in proximity to the roll 37.

The slots 12 and 16 may have a desired configuration. For example, a vertical slot of constant diameter from the manifold interior to the manifold faces may be used. However, it is preferable for the slots 12 and 16 to be angled forwardly, as shown, and to have their front surfaces 12a and 16a angled forwardly to prevent them from interfering with the travel of printed circuits, and particularly thin flex circuits, through the tunnel 31. In addition, the angle of the slots causes cleaning liquid to flow forwardly, minimizing rearward flow out of the passage and traveling over as much of the surfaces of the printed circuits as possible.

After flowing over the panels and through the passage 31, the cleaning liquid passes through controlled leakage paths for drainage to the container or sump 22, from whence it is recirculated to the heater 24 and pump 20. Thus, controlled leakage paths exist at the nips of the rolls, at the sides of the tunnel 31 and between the flanges and the rolls.

The nips of input rolls 34-35 and the output rolls 36-37 are spaced apart slightly less than the length of the smallest printed circuit to be cleaned. For example, 6 and 9 inch spacings are satisfactory when the shortest panels to be cleaned are 6 and 9 inches long.

The rolls are formed of a relatively soft material such as urethane or rubber to prevent impurities on the rolls from injuring the copper conductors. Roll diameters of 2 to 2.5 inches are suitable.

The upper rolls 34 and 36 are mounted to float vertically to facilitate passage of panels 30 having varying thicknesses. The lower rolls 33 and 37 are driven at a speed appropriate to the velocity of the production line that is processing the panels.

Support or mount structures 40 positioned at the ends of the manifold 14 have a T-shape with legs 41 fastened by bolts 42 or the like to the manifolds 14. The mount 40 is also suitably anchored to other structure (not shown) to support and position the manifold 14 at the container 22. L-shaped mounts 43 are attached to and support the ends of manifold 10. Each long leg 44 of the L-shaped mount rests on the support 40 while the short leg at the other end is supported by suitable structure (not shown). Leaf springs 45 connect the mount 40 to the support 43, such springs extending along each side of the leg 41. To couple the manifold 10 to the roll 34, arms 46 extend upwardly from the supports 43 and are fastened to journals 47 at the ends of a shaft 48 of the roll 34. Suitable supporting structure (not shown) mounts the roll shafts and bearings. The lower roll is suitably driven while the upper roll is free to move in a vertical direction.

The horizontal leaf springs 45 of the manifold mounts 40 and 43 are preloaded to offset the weight of the manifold 10 including liquid contained therein and the roll 34. With this arrangement, printed circuit panels passing through the rolls 34 and 35 will move the roll 34 upwardly and cause deflection of the leaf springs 45 resulting in parallel upward movement of the manifold 10 to enlarge the narrow passage 31, as shown by the broken lines in FIG. 3. The spring structure can be molded or fabricated, using metal or plastic as desired.

In a typical embodiment of the inventive cleaning apparatus, the slots 12 and 16 provide an orifice of, for example, 0.06 inch having a length of 25 inches. Using a one horsepower pump, there is a flow rate of 45 gallons of liquid per minute at 20 pounds per square inch through the slots.

Then, $$216 \, in^3/G \times 45 \, G/M = 9720 \, in^3/M$$

Dividing by 60 seconds $$9720 \, in^3/M \div 60 \, S = 162 \, in^3/S$$

Since there are 3 square inches in the two orifices (0.06 in $\times$ 25 in $\times$ 2), then $$162 \, in^3 S \div 3 \, in^2 = 54 \, in/S \, velocity.$$

Thus cleaning fluid flows through the orifices and the passage 31 with or without a panel in transit at a velocity of 54 inches per second.

A primary consideration in determining the flow of cleaning liquid is that the flow is sufficiently great to fill and pressurize the manifolds to provide an even flow distribution into the tunnel 31 from end to end of the slots. In other words, the slots distribute the liquid evenly across the narrow passage 31 and provide a mass flow of liquid therein.

The passage or tunnel space is related to the flow through the slots 12 and 16. With no panels between the manifolds, a clearance to the manifold faces from the center line of the nips between the rolls 32-33 and 36-37 can be, for example, 0.06 inch, thus providing a total clearance of 0.12 inch. With these exemplary dimensions, the pressure drop is distributed across the slots and the flow paths in the passage between the manifolds. If pump capacity is adequate, each of the slots can have a width, for example, from 0.06 inch to 0.12 inch. These slots will result in a substantial portion of the pressure drop being across the flow paths between the manifold faces. To provide high velocity mass flow for effective cleaning, a substantial pressure drop should take place at the work or cleaning site, i.e., in the narrow passage 21 when the panels are travelling therethrough.

If only circuits having one given thickness are to be cleaned, then the rolls and manifolds can be oriented so that the printed circuit panels are conveyed through the passage 31 with 0.06 inch, for example, clearance from each panel surface to the faces 11 and 15.

However, if the cleaning apparatus is set up for printed circuits having a thickness of 0.20 inch and flex circuits having a thickness of 0.01 inch run through, the clearance below the circuit panel will remain at 0.06 inch but the clearance between the panel and the roof of the tunnel will be on the order of 0.25 inch. In these circumstances, while cleaning is still accomplished, it has been found that the lower surface of the panel is cleaned more effectively than the upper surface of the flex circuit panel. This occurs because the pressure drops across the passage between the lower surface of the panel and the face 15 is greater than that across the passage between upper surface of the panel and the face 11. Thus, mass flow at a higher velocity occurs across the lower surface of the panel and cleans it more effectively.

Figure 2:
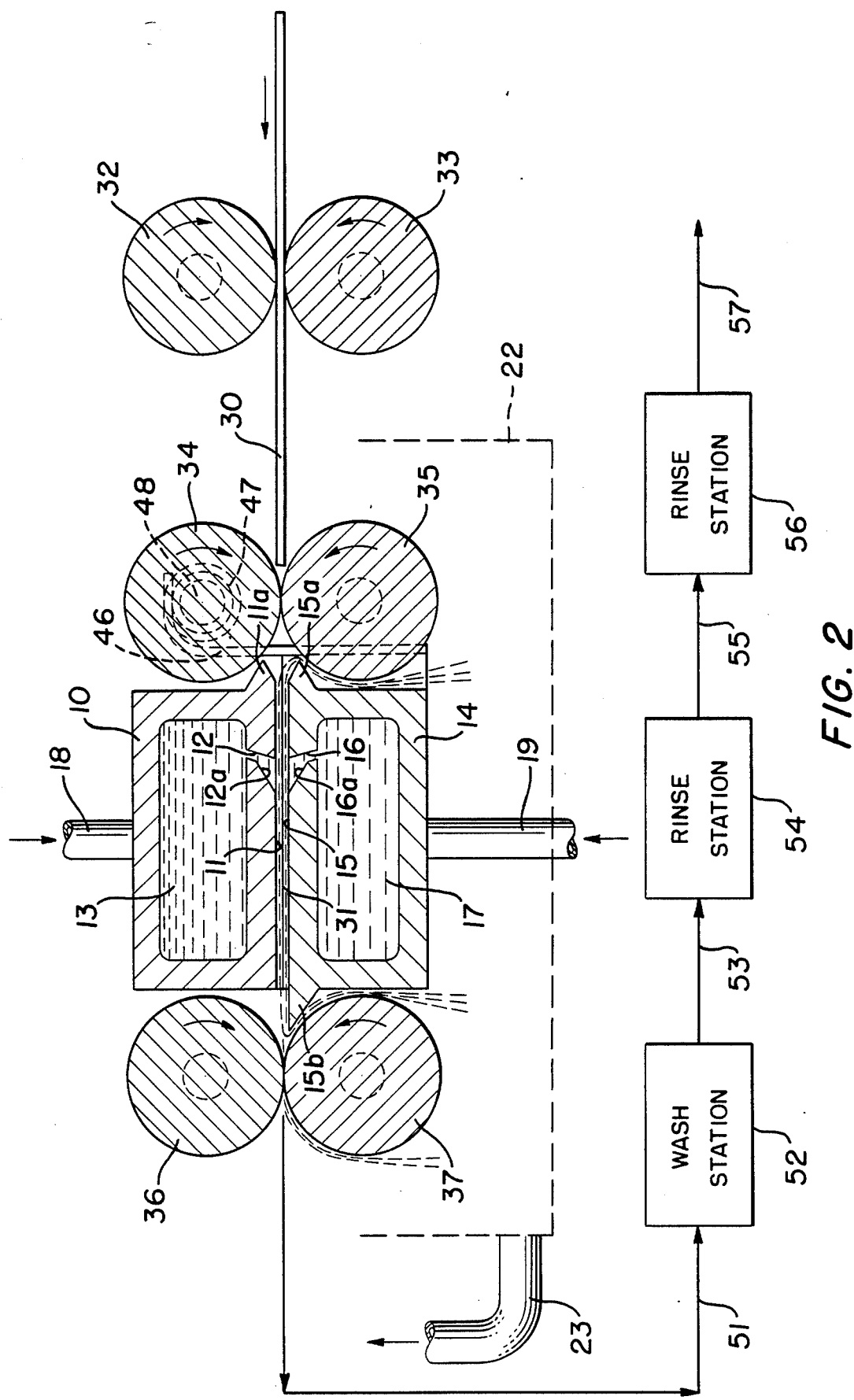
FIG. 2 is a cross-section taken along the view line 2—2 of FIG. 1 looking in the direction of the arrows, and also showing in diagrammatic form additional process stations.
Figure 3:
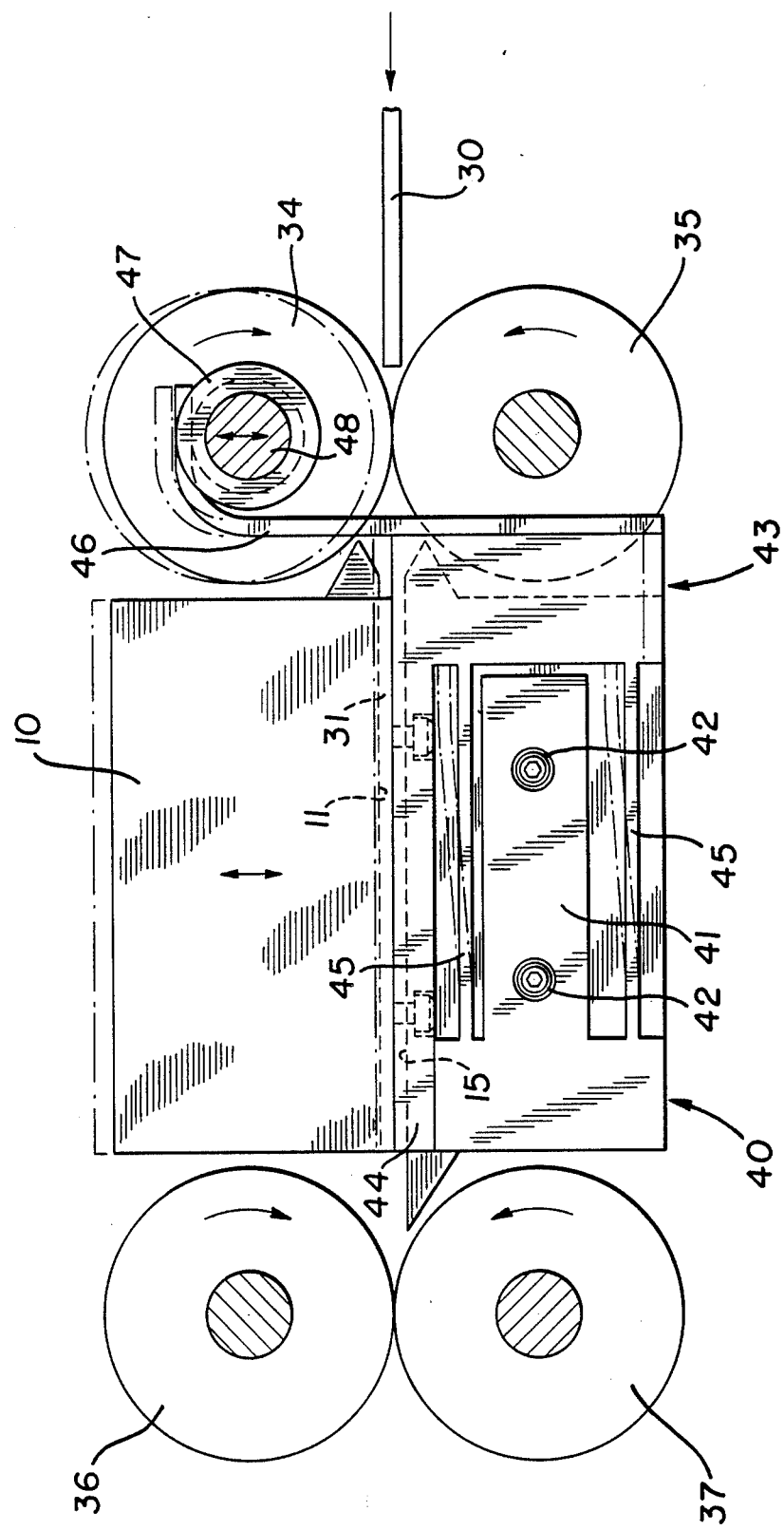
FIG. 3 is an end view of the inventive apparatus.

With the preferred embodiment of the invention shown in FIGS. 1-3, printed circuit panels of a wide variety of thickness can be accommodated and cleaned. For example, flex circuits with a thickness of 0.010 inch barely separate the rolls 33 and 34. Thus, the manifold 10 moves little if at all. However, there is an 0.06 inch clearance between both surfaces and the manifold faces.

If cleaning of thick 0.25 inch printed circuits is required, the roll 34 moves upwardly as a 0.25 inch panel passes through the nips, carrying with it the manifold 10 and thus increasing the passage or tunnel clearance by 0.25 inch. However, the clearance of 0.06 inch remains between each panel surface and the manifold faces 11 and 15.

Assuming that the 0.25 inch panel to be cleaned is only 10 inches wide, then the flow paths in the passage 31 on each side of the panel are enlarged to 0.37 inch. However, the passages of 0.06 inch between the panel surfaces and the manifold faces result in a high velocity mass flow of liquid across those surfaces toward the increased width passages, thus effectively cleaning the printed circuits.

Note that certain dimensions of the drawings have in some instances been exaggerated in the interests of clarity and the dimensions are not to scale.

In cleaning flux and other residual impurities from printed circuits that have been soldered, several processing stages can be used. Referring to FIG. 2, the first wash stages using the manifolds 10 and 14 uses a heated water-detergent solution. The panels are then delivered by a conveyor 51 to a second wash stage 52 similar to the first. Another conveyor 53 transports the printed circuits to a rinse stage 54 having the same structure as described above except only heated water is used for rinsing the panels. Finally, by conveyor 55 the panels are delivered to a second rinse stage 56 similar to the stage 54, after which the panels are carried by a conveyor 57 to suitable drying apparatus.

As discussed above, due to the effective cleaning action of the high velocity liquid in the passage 31, the process stages are short, for example 6 to 9 inches long. Thus the four stages in the cleaning system shown in FIG. 2 can be accommodated in a distance of only a few feet, a most desirable feature of the invention.

Cleaning liquid may be recirculated through the stages. For example, fresh water may be supplied to the last rinse stage and final drain will occur at the first stage. Detergent can be added at the first stages if required and draining limited from those stages.

While the apparatus and method of the invention have been described in connection with specific embodiments, it will be understood that modifications may be made by those skilled in the art and that the invention is defined by the appended claims.

I claim:

1. Apparatus for cleaning contaminants from upper and lower surfaces of planar printed circuit panels having length and width dimensions and differing thicknesses, said apparatus comprising:

conveyor means including a pair of horizontally supported driven input rolls and a pair of horizontally supported driven output rolls for conveying printed circuit panels along a horizontal path in their length direction, the nips of said input and output rolls being spaced from each other along said horizontal path a distance slightly less than the length of the shortest panel to be cleaned whereby the output rolls engage the leading edge of a panel just before its trailing edge is released by the input rolls, a lower manifold disposed below said horizontal path between said input rolls and said output rolls, said lower manifold having a generally rectangular upper face having a length substantially equal to the spacing between said input and said output rolls and a width at least as wide as the widest panel to be cleaned, an upper manifold having a rectangular lower face having substantially the same shape and size as the upper face of said lower manifold, means mounting said upper manifold above said lower manifold to provide a narrow passage disposed along said horizontal path having an inlet closely adjacent the nip of said input rolls and an output disposed closely adjacent the nip of said output rolls, said manifold mounting means being responsive to separation of the input rolls by a printed circuit panel conveyed therebetween for adjusting the height of the passage defined by the confronting faces of the manifold regardless of the thickness of the panel being cleaned, the confronting faces of said manifolds being planar and uninterrupted except for a transverse slot formed in each in proximity to the inlet of said passage and communicating with the interior of its respective manifold, and means for supplying cleaning liquid under pressure to the interiors of said upper and lower manifolds for discharge through said slots and producing a high velocity flow of liquid along substantially uniform flow paths defined by the surfaces of a panel conveyed through said passage and the confronting manifold faces, said means for supplying cleaning liquid including a container for receiving liquid discharged from the inlet and exit of said passage, a pump for recirculating the liquid, and means for heating the recirculated cleaning liquid, whereby printed circuit panels having a range of thicknesses conveyed through the passage are cleaned by high velocity liquid flowing along said flow paths.

2. Apparatus as defined in claim 1, where said slots in said upper and lower manifolds are inclined in the direction of movement of the panels through said passage.

3. Apparatus as defined in claim 1, wherein the slots are angled in the direction of movement of the panels.

4. Apparatus for cleaning contaminants from upper and lower surfaces of planar printed circuit panels having length and width dimensions and differing thicknesses, said apparatus comprising:

conveyor means including a pair of horizontally supported driven input rolls and a pair of horizontally supported driven output rolls for conveying printed circuit panels along a horizontal path in their length direction, the nips of said input and output rolls being spaced from each other along said horizontal path a distance slightly less than the length of the shortest panel to be cleaned whereby the output rolls engage the leading edge of a panel just before its trailing edge is released by the input rolls, a lower manifold disposed below said horizontal path between said input rolls and said output rolls, said lower manifold having a generally rectangular upper face having a length substantially equal to the spacing between said input and said output rolls and a width at least as wide as the widest panel to be cleaned, an upper manifold having a rectangular lower face having substantially the same shape and size as the upper face of said lower manifold, means mounting said upper manifold above said lower manifold to provide a narrow passage disposed along said horizontal path having an inlet closely adjacent the nip of said input rolls and an output disposed closely adjacent the nip of said output rolls, said manifold mounting means being responsive to separation of the input rolls by a printed circuit panel conveyed therebetween for adjusting the height of the passage defined by the confronting faces of the manifold regardless of the thickness of the panel being cleaned, the confronting faces of said manifolds being planar and uninterrupted except for a transverse slot formed in each in proximity to the inlet of said passage and communicating with the interior of its respective manifold, and means for supplying cleaning liquid under pressure to the interiors of said upper and lower manifolds for discharge through said slots and producing a high velocity flow of liquid along substantially uniform flow paths defined by the surfaces of a panel conveyed through said passage and the confronting manifold faces, said means for supplying including a pump, a container for receiving liquid flowed through the passage, and means for heating and recirculating the liquid, whereby printed circuit panels having a range of thicknesses conveyed through the passage are cleaned by high velocity liquid flowing along said flow paths.

5. Apparatus as defined in claim 4 wherein said slots in said upper and lower manifolds are included angled in the direction of movement of the panels through said passage.

* * * * *